United States Patent
Mallia et al.

(10) Patent No.: US 10,164,637 B2
(45) Date of Patent: Dec. 25, 2018

(54) LEVEL SHIFTER FOR VOLTAGE CONVERSION

(71) Applicant: QUALCOMM Incorporated, San Diego, CA (US)

(72) Inventors: Sreenivasa Mallia, Bangalore (IN); Ayush Mittal, Bangalore (IN); Krishnaswamy Thiagarajan, Bangalore (IN); Karthikeya Aruppukottai Boominathan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/441,750

(22) Filed: Feb. 24, 2017

(65) Prior Publication Data

US 2018/0248551 A1    Aug. 30, 2018

(51) Int. Cl.
    *H03K 19/0185*    (2006.01)
(52) U.S. Cl.
    CPC ........ *H03K 19/018521* (2013.01); *H03K 19/018514* (2013.01); *H03K 19/018528* (2013.01)
(58) Field of Classification Search
    CPC ... H03K 19/018521; H03K 19/018528; H03K 19/018514; H03K 19/018564; H03K 19/018571; H03K 19/018578
    See application file for complete search history.

(56) References Cited

U.S. PATENT DOCUMENTS

| 5,963,054 | A |   | 10/1999 | Cochran et al. |
|-----------|---|---|---------|----------------|
| 5,969,542 | A | * | 10/1999 | Maley ............ H03K 3/012 326/17 |
| 7,167,027 | B2 |  | 1/2007  | Matsuo et al. |
| 7,696,804 | B2 | * | 4/2010  | Thorp .......... H03K 3/356182 326/68 |
| 8,395,433 | B2 |  | 3/2013  | Rien et al. |
| 8,659,341 | B2 |  | 2/2014  | Foley |
| 8,854,104 | B2 | * | 10/2014 | Chung ............ H03L 5/00 326/80 |

(Continued)

OTHER PUBLICATIONS

Khorasani M., et al., "Low-Power Static and Dynamic High-Voltage CMOS Level-Shifter Circuits", IEEE, International Symposium on Circuits and Systems, 2008, pp. 1946-1949.

(Continued)

*Primary Examiner* — Jung Kim
(74) *Attorney, Agent, or Firm* — Procopio, Cory, Hargreaves & Savitch LLP/Qualcomm

(57) ABSTRACT

A device and method for shifting voltage levels within a circuit are provided. An aspect of the disclosure provides a level shifting circuit for shifting a first logic domain to a second logic domain. In particular, the level shifting circuit can receive an input signal having a first logic domain with a first high voltage and a first low voltage. The level shifting circuit can receive inputs corresponding to a second high voltage and a second low voltage from the second logic domain. The level shifting circuit can concurrently switch the first high voltage and first low voltage at the input to the second high voltage and the second low voltage to produce a level-shifted version of the input signal at the output. The level shifting circuit can also have a plurality of guard transistors that prevent overvoltage of the circuit components.

16 Claims, 3 Drawing Sheets

(56) References Cited

U.S. PATENT DOCUMENTS

| | | |
|---|---|---|
| 9,373,275 B2 | 6/2016 | Chuang et al. |
| 2010/0134146 A1 | 6/2010 | Na |
| 2010/0188131 A1 | 7/2010 | Zhang et al. |
| 2016/0142056 A1 | 5/2016 | Kuo |

OTHER PUBLICATIONS

International Search Report and Written Opinion—PCT/US2018/013869—ISA/EPO—dated Jun. 18, 2018.

* cited by examiner

LEVEL SHIFTER FOR VOLTAGE CONVERSION

BACKGROUND

Technological Field

This disclosure relates to digital circuits and circuit design. More particularly, this disclosure relates to shifting voltage level requirements within digital circuits.

Related Art

Digital circuits can use a consistent logic for internal signals, such as a digital 0 or 1, for example. The logic can be represented by discrete logic domains or voltage (V) values. Those logic domains, however, can vary from one system to another. Interconnecting any two systems or circuits having different logic families can require special interface circuits such as level shifters, for example.

A level shifter can couple one digital circuit using a first logic domain to another digital circuit that uses a second logic domain. For example, a first logic domain can use a negative (−) 0.5V to represent a digital 0 and a positive (+) 0.5V for a digital 1. A second logic domain can have a higher or lower second range of voltages (e.g., 0V and +1V, or +0.5 and +1.5) that may not be supported by the circuitry of the first digital circuit. The level shifter can translate the first logic domain to the second logic domain.

In some examples, the first logic domain and the second logic domain can require multiple stages of level shifters due to the difference in voltage values associated with the digital values. Therefore, level shifters can be cascaded, using two or more level shifters at once to change the first logic domain into a second. There can be one or more level shifters at each system operable to increase or decrease the voltage level of various logic families.

Some level shifters have significant reliability and leakage current issues, leading to unintended power drain and lower efficiency. In some examples, this can be caused by a large difference between the first logic domain and the second logic domain, overwhelming level shifter circuitry.

SUMMARY

An aspect of the disclosure provides a level shifting circuit for shifting a first logic domain to a second logic domain. The level shifting circuit can have a first pair of cross-coupled transistors having sources coupled to a first voltage supply configured to receive a first voltage from the second logic domain. The level shifting circuit can also have a second pair of cross-coupled transistors having sources coupled to a second voltage supply configured to receive a second voltage from the second logic domain. The level shifting circuit can also have a first plurality of transistors having gates coupled to a third voltage supply. The first plurality of transistors can be coupled in series between a first transistor of the first pair and a first transistor of the second pair and further having a first output located between two transistors of the first plurality of transistors. The level shifting circuit can also have a second plurality of transistors having gates coupled to a fourth voltage supply. The second plurality of transistors can be coupled in series between a second transistor of the first pair and a second transistor of the second pair and further having a second output located between two transistors of the second plurality of transistors.

Another aspect of the disclosure provides a method for shifting a first logic domain to a second logic domain in an electrical circuit. The method can include receiving, at a first input switch and a second input switch, an input signal having the first logic domain. The first logic domain can have a first high voltage and a first low voltage. The method can also include receiving an inverted version of the input signal at a third input switch and a fourth input switch. The method can also include receiving a second high voltage from a second logic domain at a first conversion switch and a second conversion switch. The second logic domain can be different from the first logic domain. The method can also include receiving a second low voltage from the second logic domain at a third conversion switch and a fourth conversion switch. The method can also include first providing the second low voltage of the second logic domain to a first output. The method can also include second providing the second high voltage of the second logic domain to a second output concurrently with the first providing. The method can also include preventing, by a plurality of guard switches, any of the first conversion switch, the second conversion switch, the third conversion switch, and the fourth conversion switch from overvoltage during the first providing and the second providing.

Another aspect of the disclosure provides an apparatus for shifting a first logic domain to a second logic domain in an electrical circuit. The apparatus can have first receiving means for receiving an input signal having the first logic domain. The first logic domain can have a first high logic voltage and a first low logic voltage. The apparatus can also have second receiving means for receiving an inverted version of the input signal. The apparatus can also have first conversion means for receiving a second high logic voltage from a second logic domain different from the first logic domain. The apparatus can also have second conversion means for receiving a second low logic voltage from the second logic domain. The apparatus can also have first shifting means for first shifting the first high logic voltage of the first logic domain to the second high logic voltage of the second logic domain. The apparatus can also have second shifting means for second shifting the first low logic voltage of the first logic domain to the second low logic voltage of the second logic domain concurrently with the first shifting. The apparatus can also have preventing means for preventing any of the first receiving means, the second receiving means, the first conversion means, and the second means from overvoltage during the first shifting and the second shifting.

Another aspect of the disclosure provides a level shifting circuit for concurrently shifting a first high logic voltage and a first low logic voltage of a first logic domain, to a second high logic voltage and a second low logic voltage of a second logic domain. The second logic domain can be different from the first logic domain. The level shifting circuit can have a first portion. The first portion can have a first pair of input switches operable to receive an input signal from the first logic domain. The first portion can also have a first pair of conversion switches operable to receive voltages from the second logic family. The level shifting circuit can also have a second portion. The second portion can have a second pair of input switches operable to receive an inverted version of the input signal. The second portion can also have a second pair of conversion switches operable to receive voltages from the second logic family, the second portion coupled to the first portion at a second high input and a second low input. The level shifting circuit can also have a plurality of guard switches coupling the first portion to the second portion, and operable to prevent overvoltage of the first and second pair of conversion switches and the first and second pair of input switches. The level shifting circuit can also have a first output coupled to a portion of the plurality of guard switches operable to provide a shifted version of the input signal using the second logic family.

BRIEF DESCRIPTION OF THE DRAWINGS

The details of embodiments of the present disclosure, both as to their structure and operation, may be gleaned in part by study of the accompanying drawings, in which like reference numerals refer to like parts, and in which.

DETAILED DESCRIPTION

Figure 1:
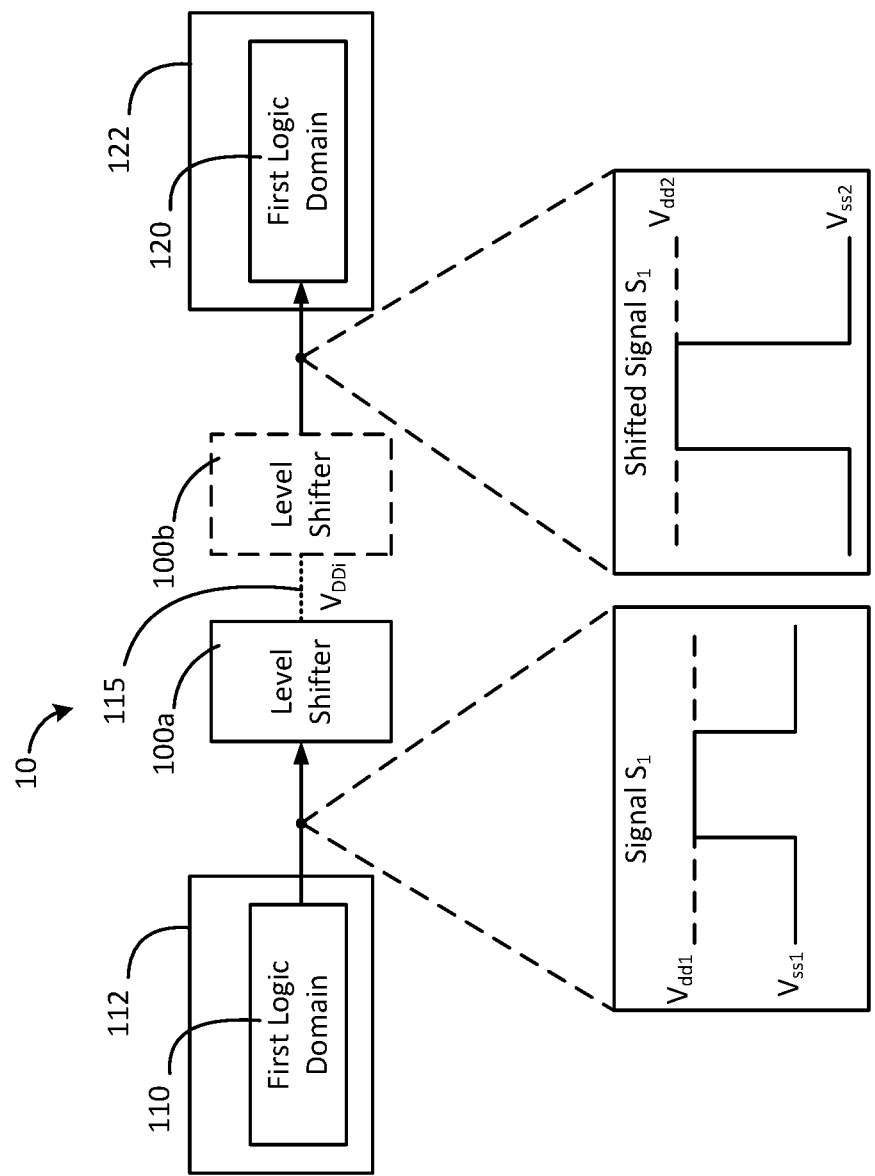
FIG. 1 is a functional block diagram of a level shifting circuit.

FIG. 1 is a functional block diagram of a level shifting circuit. A level shifting circuit 10 can have one or more level shifters 100. The level shifters 100 are labeled as 100a and 100b but can be referred to collectively as level shifters 100. The level shifters 100 can shift, for example, a first logic domain 110 of a signal $S_1$ from a first circuit 112 to a second logic domain 120 as a shifted signal $S_1$ supplied to a second circuit 122. The first circuit 112 and the second circuit 122 can be, for example, digital circuits that discrete voltage values for digital values. For example, the first digital circuit can use the first logic domain 110 having a lower voltage $V_{SS1}$ (e.g., 0.0V) for a digital zero (0) and a higher voltage $V_{DD1}$ (e.g., +0.8V) for a digital one (1). The voltage $V_{DD1}$ can be a rail voltage supply or other power supply, for example. In some examples, the voltage $V_{SS1}$ can be a ground or negative rail voltage. As shown, the range of values $V_{SS1}$-$V_{DD1}$ (e.g., 0.0V-0.8V) can define the first logic domain 110. One of ordinary skill will appreciate that other voltage levels are also possible for the first logic domain 110.

The second circuit 122 can operate using the second logic domain 120 for 0 and 1. For example, the second logic domain 120 can have a different range of voltage levels than the first logic domain 110. In some embodiments, the second logic domain 120 can use a range of values $V_{SS2}$-$V_{DD2}$, for example, −0.4V for a digital zero and +1.8V for a digital one.

The second circuit 122 can operate using the second logic domain 120 for 0 and 1. For example, the second logic domain 120 can have a different range of voltage levels than the first logic domain 110. In some embodiments, the second logic domain 120 can use a range of values $V_{ss1}$-$V_{dd1}$, for example, −0.4V for a digital zero and +1.8V for a digital one.

The level shifters 100 can implement N-type or P-type metal oxide semiconductors (MOS), or NMOS and PMOS, transistors as one or more switches in order to provide level shifting from the first logic domain 110 to the second logic domain 120. In some examples, NMOS switches having leakage currents can negatively affect power dissipation and the performance of the level shifters 100. Accordingly, in some embodiments (as described below), the NMOS switches can then be negatively biased below −0.4 volts. This arrangement can improve the ON-OFF switch resistance ratio of the NMOS transistors.

As shown in FIG. 1, the level shifting circuit 10 may need to shift from the first logic domain 110 (e.g., using 0V to 0.8V) to the second logic domain 120 (e.g., using, −0.4V to 1.7V). This presents a 2.1V differential between high (1) and low (0) digital values. Such a voltage drop can, in some level shifters, create an overvoltage condition, damaging the circuit or causing it to fail due to reliability and leakage current issues. Thus, more than one level shifter 100 may be needed to shift the first logic domain 110 to the second logic domain 120. The one or more level shifters 100 may be needed because certain level shifting circuitry may not be able to operate at increased high-low voltage differentials.

In some examples the level shifting circuit 10 can shift the first logic domain 110 to an intermediate logic domain 115 using the level shifter 100a, and then from the intermediate logic domain 115 to the second logic domain 120 using the second level shifter 100b. For example, the level shifter 100a can shift $V_{DD1}$ to an intermediate value $V_{DD}$ before the level shifter 100b can shift the intermediate $V_{DD}$ to $V_{DD2}$ of the second logic domain 120. Some level shifting circuits 10 may only shift $V_{DD1}$ to $V_{DD2}$, ignoring $V_{SS}$, or allowing $V_{SS}$ to remain at the voltage level defined by the first logic domain 110 (e.g., $V_{ss1}$). This can limit level shifting capabilities of the level shifting circuit 10.

Certain cascaded level shifters 100 can require additional biasing circuitry, such as in a Hubble level shifter having three levels of shifting (e.g., three level shifters 100). In the Hubble level shifter, there are two level shifters 100 for supply level shifting from 1.0V to 1.8V and then from 1.8V to 1.3V (e.g., $V_{DD1}$), and a third level shifter 100 for ground level shifting from 0V to negative (−)0.4V. This further assumes that the threshold voltage ($V_{th}$) of the NMOS is less than 0.4V, however that may not always be true across process and temperature variations in the transistors.

Some level shifters can have pairs of cross coupled transistors with the input transistors shielded from overvoltage by cascode devices. However, such a topology can require additional bias voltages for the cascade devices. In some embodiments where using large numbers of level shifters (e.g., 80-100 level shifters 100), power consumption under such conditions may be unacceptably high. Implementing a single level shifter 100 as disclosed herein can reduce space requirements and minimize power dissipation.

Figure 2:
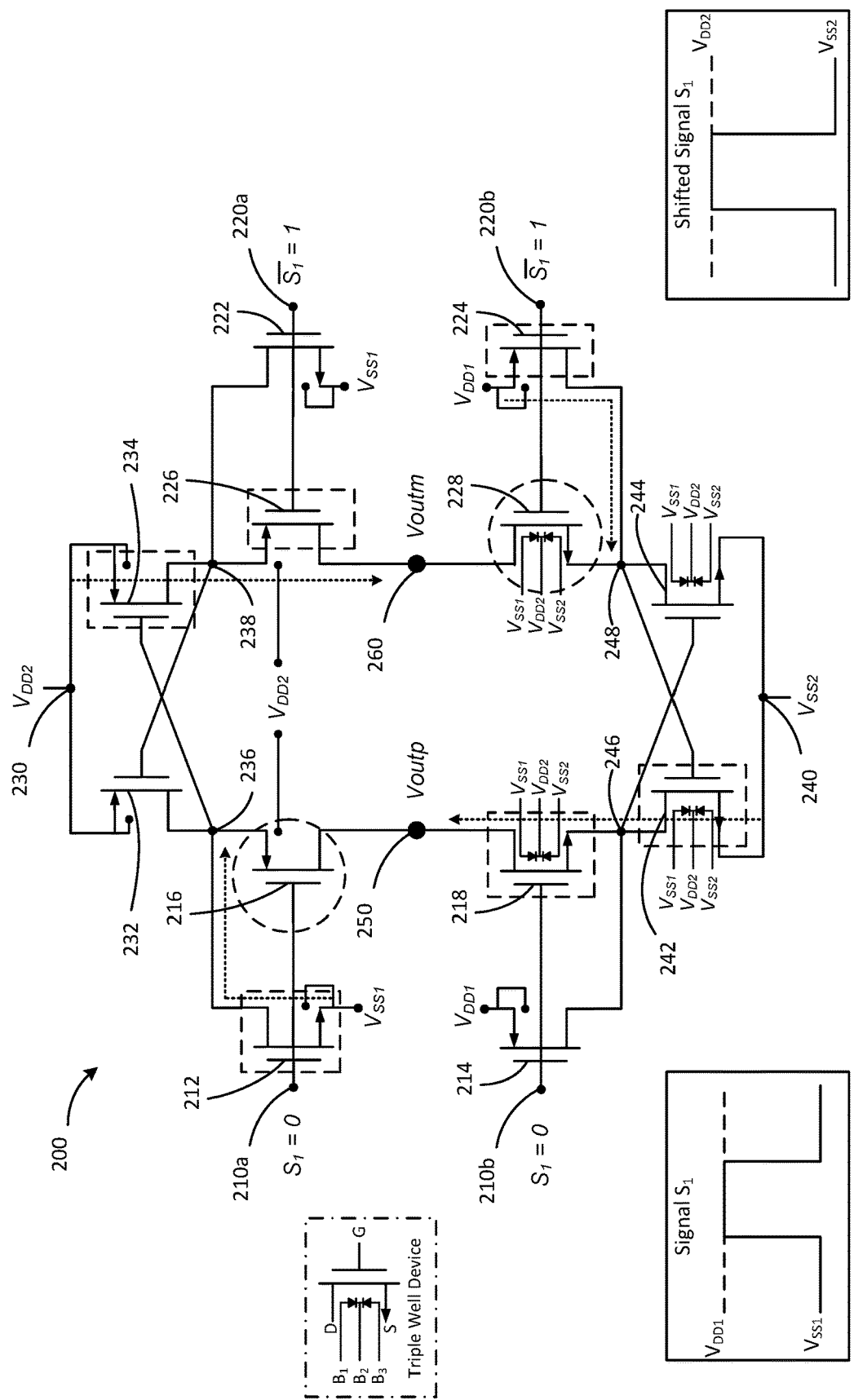
FIG. 2 is a circuit diagram of an embodiment of a level shifter circuit.

FIG. 2 is a circuit diagram of an embodiment of a level shifter circuit. A level shifter 200 can be used as a single level shifter 100 of FIG. 1. The level shifter 200 is operable to shift both positive supply ($V_{DD}$) and negative supply ($V_{SS}$) concurrently. Thus, the multiple level shifters 100 of FIG. 1 (and the exemplary Hubble level shifter) described above, can be minimized and replaced by, for example, a single level shifting stage of the level shifter 200. The level shifter 200 can shift the first logic domain 110 (e.g., 0V-0.8V) to the second logic domain 120 (e.g., −0.4V-1.7V) in a single shifting stage (e.g., the level shifter 100). It should be appreciated that any voltage levels/values can be used for the level shifter 200.

In some embodiments, the level shifter 200 can have four inputs or voltage supplies. The first voltage supply, a first high input 210, can receive an input voltage according to a digital signal $S_1$. The signal $S_1$ can vary, for example, between a first high voltage $V_{DD1}$ and a first low voltage $V_{SS1}$ representing a 1 and a 0, for example. The high voltage $V_{DD1}$ can be from the first logic domain 110 (e.g., 0.8V). The first high input 210 is shown as a first high input 210a and a first high input 210b. This can allow the first high input 210a and the first high input 210b to be separated on different components but receive the same input signal $S_1$ and voltage input ($V_{DD1}$). They can be collectively referred to herein as the first high input 210.

The second voltage supply, a first low input 220, can receive an input voltage according to an inverse of the digital signal $S_1$ or $\overline{S_1}$ (i.e., read "$S_1$-bar"). The first low input 220 can thus receive the low voltage $V_{SS1}$ from the first logic domain 110 (e.g., 0V). Similar to above, the first low input 220 is shown as a first low input 220a and a first low input 220b. The voltages or signals applied to the first high input 210 and the first low input 220 can be inverses of one another, or for example, the opposite digital value of each other. The digital signal $S_1$ can be provided to the first high input 210 while an inverse of the digital signal $S_1$, or $\overline{S_1}$ can be provided to the first low input 220. Therefore the voltage value supplied to the first high input 210 can be the opposite digital value of the first low input 220 for the particular logic domain family.

The third voltage supply, a second high input 230, can receive the high voltage for the second logic domain 120 (e.g., $V_{DD2}$, 1.7V). The high voltage from the second logic domain 120 may be referred to herein as $V_{DD2}$. The second high input 230 can also be referred to as a shifted input. The fourth voltage supply, a second low input 240, can receive the low voltage for the second logic domain 120 (e.g., −0.4V). The low voltage for the second logic domain 120 may be referred to herein as $V_{SS2}$. The second low input 230 can also be referred to as a shifted input.

Multiple transistors can be arranged to provide switching for the conversion from the first logic domain (e.g., voltage range) to the second logic domain (e.g., voltage range). The first high input 210 can be coupled to a gate of a first input switch 212 and a gate of a second input switch 214. In some embodiments, the first input switch 212 and the second input switch 214 can be coupled together at their respective gates. The first high input 210 can also be coupled to a gate of a first guard switch 216 and a gate of a second guard switch 218.

The first low input 220 can be coupled to a gate of a third input switch 222 and a gate of a fourth input switch 224. In some embodiments, the third input switch 222 and the fourth input switch 224 can be coupled together at their respective gates. The first low input 220 can also be coupled to a gate of a third guard switch 226 and a gate of a fourth guard switch 228.

The second high input 230 can be coupled to the sources of each of a first conversion switch 232 and a second conversion switch 234. The sources of each of the first conversion switch 232 and the second conversion switch 234 can further be coupled to a respective bulk terminal, further connecting the bulk terminals to the second high input 230. A drain of the first conversion switch 232 can be coupled to a source of the first guard switch 216, a drain of the first input switch 212, and a gate of the second conversion switch 234 at a node 236. Similarly, a drain of the second conversion switch 234 can be coupled to a source of the third guard switch 226, a drain of the third input switch 222, and a gate of the first conversion switch 232 at a node 238. The connections of the first conversion switch 232 and the second conversion switch 234 can have a cross-coupled arrangement.

The second low input 240 can be coupled to the sources of each of a third conversion switch 242 and a fourth conversion switch 244. A drain of the third conversion switch 242 can be coupled to a drain of the second input switch 214, a source of the second guard switch 218, and a gate of the fourth conversion switch 244 at a node 246. Similarly, the drain of the fourth conversion switch 244 can be coupled to a drain of the fourth input switch 224, a source of the fourth guard switch 228, and the gate of the third conversion switch 242 and node 248. The connections of the third conversion switch 242 and the fourth conversion switch 244 can have a cross-coupled arrangement.

In some embodiments, the first guard switch 216, the second guard switch 218, the third guard switch 226, and the fourth guard switch 228 can be arranged between the cross-couplings of the various conversion switches as shown. Thus in some embodiments, the first guard switch 216, the second guard switch 218, the third guard switch 226, and the fourth guard switch 228 can be disposed between the cross-coupling of the first conversion switch 232 and the second conversion switch 234, and the cross-coupling of the third conversion switch 242 and the fourth conversion switch 244. Additionally, the first output 250 can be coupled to the drains of the first guard switch 216 and the second guard switch 218 while the second output 260 can be coupled to the to the drains of the third guard switch 226 and the fourth guard switch 228.

As noted above, the input voltages from $S_1$, or $\overline{S_1}$ can be coupled to the gates of the guard switches and the first output 250 and the second output 260 can be coupled to the drains of the guard switches. This can provide an overvoltage protection to the other circuitry by preventing continuity between the second high input 230 and the second low input 240.

In some embodiments, the third guard switch 218, the fourth guard switch 228, the third conversion switch 242, and the fourth conversion switch 244 can be implemented as triple well devices. The triple well devices can have six total connections for a gate, a source, a drain, and three bulk terminals (e.g., B1, B2, B3). An exemplary triple well device is illustrated in a dot-dash box in FIG. 2. Each of the bulk terminals can be configured as an N-well or a P-well bulk terminal. In some examples, the triple well devices can eliminate certain reliability issues over three terminal or four terminal transistors, for example.

The bulk terminal connections (e.g., for B1, B2, B3) can be the same for each of the third guard switch 218, the fourth guard switch 228, the third conversion switch 242, and the fourth conversion switch 244. For example, each of the triple well devices of the third guard switch 218, the fourth guard switch 228, the third conversion switch 242, and the fourth conversion switch 244 can have B1 (P-well bulk) coupled to $V_{SS1}$, B2 (N-well bulk) coupled to $V_{DD2}$, and B3 (P-well bulk) coupled to $V_{SS2}$. In some implementations, these specific connections can provide certain advantages, reducing reliability and leakage issues associated with different transistor configurations (e.g., with three terminal and four terminal transistors).

In such embodiments, the remaining transistors (e.g., switches) of the level shifter 200 can be implemented as four terminal transistors (e.g., MOSFET) having a gate, a drain, a source, and a single bulk terminal. A source of the first input switch 212 and a source of the third input switch 222 can each be coupled to (e.g., receive) a voltage equivalent to the low voltage ($V_{SS1}$) of the first logic domain 110 (e.g., 0V or ground). The sources of both of the first input switch 212 and the third input switch 222 can further be coupled to their respective bulk terminal (e.g., body terminal), so that the voltage $V_{SS1}$ is also coupled to the bulk terminals.

A source of the second input switch 214 and a source of the fourth input switch 224 can each be coupled to (e.g., to receive) the high voltage ($V_{DD1}$) of the first logic domain 110 (e.g., 0.8V). The sources of both of the second input switch 214 and the fourth input switch 224 can further be coupled to their respective bulk terminal (e.g., body terminal), so that the voltage $V_{DD1}$ is also coupled to the bulk terminals.

A bulk terminal of each of the first guard switch 216 and the third guard switch 226 can each be coupled to the voltage $V_{DD2}$.

The first high input 210 can receive the signal $S_1$ and the first low input 220 can receive $\overline{S_1}$, each having the first logic domain 110 ranging from, for example 0V to 0.8V. As the voltage at the first high input 210 and the first low input 220 switch from high ($V_{DD1}$) to low ($V_{SS1}$) and back, the various switches of the level shifter 200 can convert the first logic domain 110 to the second logic domain 120 at a first output 250 ($V_{OUTP}$) and a second output 260 ($V_{OUTM}$). The voltage value at the output 260 may generally be the opposite, in terms of the logic domain, of the voltage value at the output 250.

For example, if the signal $S_1$ at the first high input 210 is high (e.g., 0.8V), the first input switch 212 turns on, allowing the value of $V_{SS1}$ (e.g., 0V) to be present at the node 236 and the gate of the second conversion switch 234. The second conversion switch 234 is switched then also switched on, allowing the voltage $V_{DD2}$ (e.g., 1.7V) at the second high input 230 to flow to the node 238. The third guard switch 226 is switched on by the presence of the voltage $V_{SS1}$ (e.g., 0V) at the first low input 120 (e.g., from $\overline{S_1}$). This provides the voltage $V_{DD2}$ at the second high input 230 to the second output 260. The first input switch 212, the second conversion switch 234, the second guard switch 218, the third guard switch 226, the third conversion switch 242, and the fourth input switch are all "ON" with $V_{DD1}$ applied to the first high input 210 (and $V_{SS1}$ applied to the first low input 220) as shown in dashed boxes. The second input switch 214, the first guard switch 216, the first conversion switch 232, the third input switch 222, and the fourth conversion switch 244 are all switched "OFF" in this instance. The OFF state of the first guard switch 216 and the fourth guard switch is indicated with a dashed circle. As used herein, an "ON" state of one or more transistors, or switches, can refer to a state in which the gate-to-source voltage is above threshold and transconductance from source-to-drain or drain-to-source of a respective transistor, or switch, is greater than zero. As used herein, an "OFF" state can refer to a below-threshold state of a transistor, or switch, where transconductance is approximately zero, or at least negligible.

On the other side of the level shifter 200, the first low input 220 is low, receiving the voltage $V_{SS1}$ because $\overline{S_1}$ is present and the value is opposite the value of $S_1$ at the first high input 210. Accordingly, the fourth input switch 224, the third conversion switch 242, and the third guard switch 226 are switched on, indicated with dashed boxes. The voltage $V_{SS2}$ at the second low input 240 (e.g., −0.4V) is then present at the first output 250 (shown with a dotted line).

In some embodiments, with the voltage $V_{DD1}$ (e.g., 0.8V) at the first high input 210 and the voltage $V_{SS1}$ (e.g., 0.0V) at the first low input 220, the first guard switch 216 and the fourth guard switch 228 are OFF. The position and bias of the first guard switch 216 and the fourth guard switch 228 can aid in preventing overvoltage of the various switches/transistors within the level shifter 200. For example, using the second logic domain 120 with negative (−) 0.4V to +1.7V results in a 2.1V voltage range. If such a voltage was applied across a single switch (e.g., the conversion switches) within the level shifter 200, they may be damaged by exceeding the maximum gate-to-source voltage (Vgs) or drain-to-source voltage (Vds) of a given circuit component. In this example, the first guard switch 216 and the fourth guard switch 228 prevent any of the transistors (switches) from encountering such a voltage range.

Figure 3:
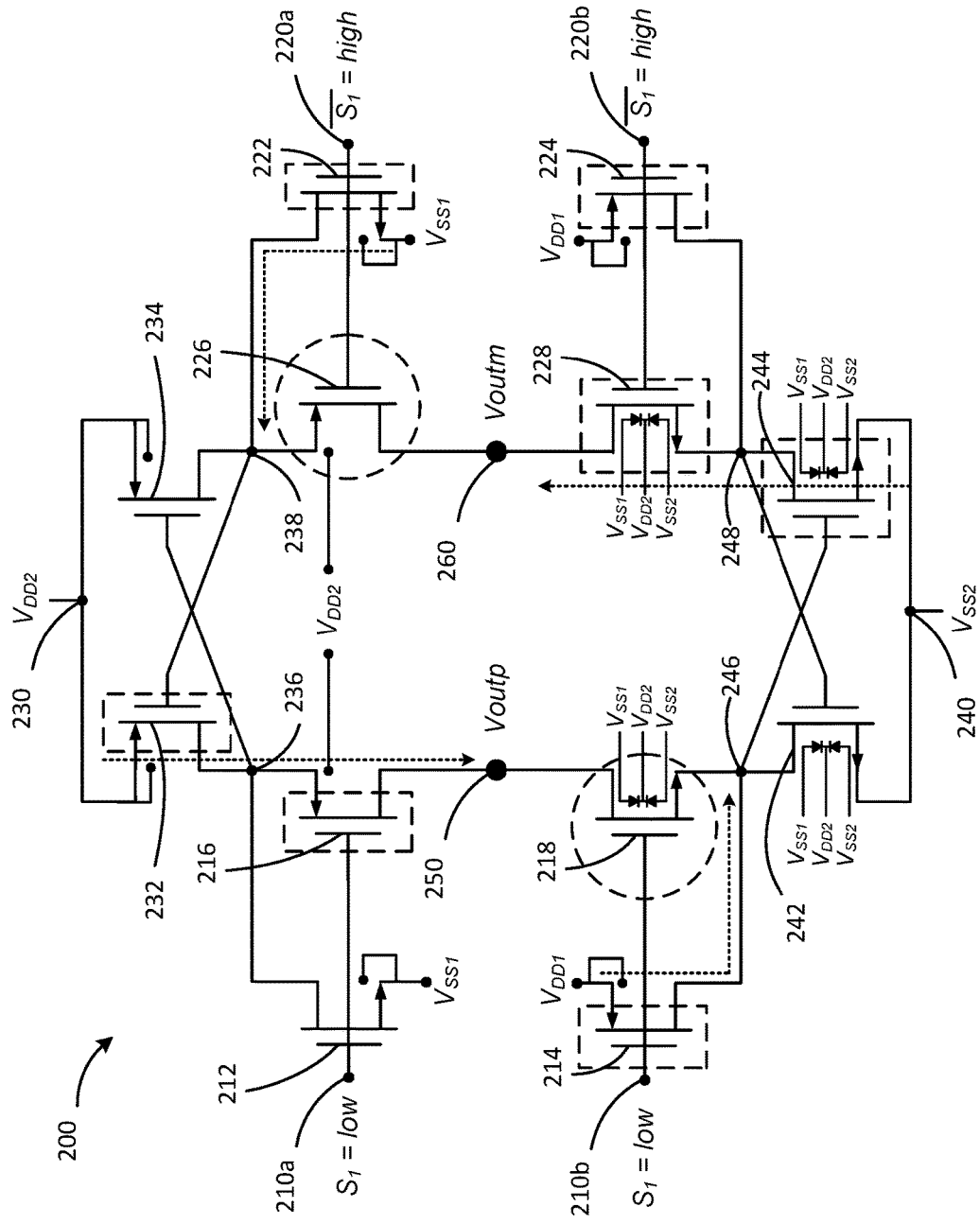
FIG. 3 is a circuit diagram of an embodiment of the level shifter circuit of FIG. 2.

FIG. 3 is a circuit diagram of an embodiment of the level shifter circuit of FIG. 2. The arrangement shown in FIG. 3 is similar to that of FIG. 2, showing the opposite digital value, the first low voltage $V_{SS1}$ present at the first high input 210. Because the $S_1$ is applied to the first low input 220, the opposite the logic value, or the first high voltage $V_{DD1}$, is present.

Therefore, when the signal $S_1$ is low, the first high input 210 receives the voltage $V_{SS1}$ (e.g., 0V), the opposite switches from that of FIG. 2 are actuated (e.g., turned ON) providing the voltage $V_{SS2}$ (e.g., −0.4V) present at the second low input 240 to flow through fourth conversion switch 244 and the fourth guard switch 228 to the second output 260. The ON states of the switches is indicated with dashed boxes. Similarly, the voltage $V_{DD2}$ (e.g., +1.7V) present at the second high input 230 can then flow through the first conversion switch 232 and the first guard switch 216 to the first output 150.

In the same instant, the first guard switch 216 and the fourth guard switch 228 are both OFF (show with dashed circles). This can prevent any single component of the level shifter 200 from being exposed to the full potential difference from the second high input 230 and the second low input 240.

Thus, for example, the signal $S_1$ at the first high input 210 (and $\overline{S_1}$ at the first low input 220), having the first logic domain 110 (e.g., 0V-0.8V) can be shifted to a signal $S_2$ at the second output 260 (and a signal $\overline{S_2}$ at the first output 150) with the second logic domain 120 (e.g., −0.4V-+1.7V)

In some embodiments, a current circuit (not shown) can be coupled to the second high input 230 and the second low input 240 to provide the second high voltage and the second low voltage, respectively. Given the guard switches and the arrangement of the conversion switches, there is no need for additional biasing circuits. This arrangement further eliminates excessive leakage current and minimizes the number of transistors required also minimizing the size of the circuit.

Those of skill will appreciate that the various illustrative blocks described in connection with the embodiments disclosed herein can be implemented in various forms. Some blocks have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a block or step is for ease of description. Specific functions or steps can be moved from one block or distributed across to blocks without departing from the present disclosure.

The various illustrative logical blocks described in connection with the embodiments disclosed herein, can be implemented or performed with a general purpose processor, a digital signal processor (DSP), application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the present disclosure. Various modifications to these embodiments will be readily apparent to those skilled in the art, and the generic principles described herein can be applied to other embodiments without departing from the spirit or scope of the present disclosure. Thus, it is to be understood that the description and drawings presented herein represent a presently preferred embodiment of the present disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

The invention claimed is:

1. A level shifting circuit for shifting a first logic domain to a second logic domain, the level shifting circuit comprising:
   a first pair of cross-coupled transistors having sources coupled to a first voltage supply configured to receive a first voltage from the second logic domain and each transistor of the first pair of cross-coupled transistors having its gate directly coupled to the drain of the opposite transistor of the first pair of cross-coupled transistors;
   a second pair of cross-coupled transistors having sources coupled to a second voltage supply configured to receive a second voltage from the second logic domain and each transistor of the second pair of cross-coupled transistors having its gate directly coupled to the drain of the opposite transistor of the second pair of cross-coupled transistors;
   a first plurality of transistors having gates coupled to a third voltage supply, the first plurality of transistors coupled in series between a first transistor of the first pair and a first transistor of the second pair and further having a first output located between two transistors of the first plurality of transistors;
   a second plurality of transistors having gates coupled to a fourth voltage supply, the second plurality of transistors coupled in series between a second transistor of the first pair and a second transistor of the second pair and further having a second output located between two transistors of the second plurality of transistors; and
   wherein a signal at the fourth voltage supply comprises an inverted logic level of a logic level of the signal at the third voltage supply.

2. The level shifting circuit of claim 1, wherein the first pair of cross-coupled transistors is coupled between the first voltage supply and the first plurality of transistors; and
   wherein the second pair of cross-coupled transistors is coupled between the second voltage supply and the second plurality of transistors.

3. The level shifting circuit of claim 1, wherein a first output voltage of the first output is at a different voltage level than a second output voltage at the second output.

4. The level shifting circuit of claim 3, wherein the first pair of cross-coupled transistors is configured to level shift a voltage at the third voltage supply to the first output voltage; and
   wherein the second pair of cross-coupled transistors are configured to level shift a voltage at the fourth voltage supply to the second output voltage concurrently with the first output voltage.

5. The level shifting circuit of claim 2 wherein the first plurality of transistors comprises a first guard switch and a second guard switch and the second plurality of transistors comprises a third guard switch and a fourth guard switch, and
   wherein the first output is coupled to a drain of the first guard switch and a drain of the second guard switch, and the second output is coupled to a drain of the third guard switch and a drain of the fourth guard switch.

6. The level shifting circuit of claim 1 wherein the first voltage comprises 1.7 volts and the second voltage comprises negative 0.4 volts.

7. The level shifting circuit of claim 1 wherein the second pair, at least one transistor of the first plurality, and at least one transistor of the second plurality comprise triple well devices.

8. The level shifting circuit of claim 1 wherein the first plurality of transistors and the second plurality of transistors are configured to prevent overvoltage of the first pair and the second pair, wherein overvoltage comprises a potential difference of greater than 1.5 volts from gate-to-source or drain-to-source across any one of the first pair and the second pair.

9. A level shifting circuit for shifting a first logic domain to a second logic domain, the level shifting circuit comprising:
   a first pair of cross-coupled transistors having sources coupled to a first voltage supply configured to receive a first voltage from the second logic domain and each transistor of the first pair of cross-coupled transistors having its gate directly coupled to the drain of the opposite transistor of the first pair of cross-coupled transistors;
   a second pair of cross-coupled transistors having sources coupled to a second voltage supply configured to receive a second voltage from the second logic domain and each transistor of the second pair of cross-coupled transistors having its gate directly coupled to the drain of the opposite transistor of the second pair of cross-coupled transistors;
   a first plurality of transistors having gates coupled to a third voltage supply, the first plurality of transistors coupled in series between a first transistor of the first pair and a first transistor of the second pair and further having a first output located between two transistors of the first plurality of transistors;
   a second plurality of transistors having gates coupled to a fourth voltage supply, the second plurality of transistors coupled in series between a second transistor of the first pair and a second transistor of the second pair and further having a second output located between two transistors of the second plurality of transistors; and wherein the second pair, at least one transistor of the first plurality, and at least one transistor of the second plurality comprise triple well devices.

10. The level shifting circuit of claim 9, wherein the first pair of cross-coupled transistors is coupled between the first voltage supply and the first plurality of transistors; and wherein the second pair of cross-coupled transistors is coupled between the second voltage supply and the second plurality of transistors.

11. The level shifting circuit of claim 9, wherein a signal at the fourth voltage supply comprises an inverted logic level of a logic level of the signal at the third voltage supply.

12. The level shifting circuit of claim 9, wherein a first output voltage of the first output is at a different voltage level than a second output voltage at the second output.

13. The level shifting circuit of claim 12, wherein the first pair of cross-coupled transistors is configured to level shift a voltage at the third voltage supply to the first output voltage; and wherein the second pair of cross-coupled transistors are configured to level shift a voltage at the fourth voltage supply to the second output voltage concurrently with the first output voltage.

14. The level shifting circuit of claim 10 wherein the first plurality of transistors comprises a first guard switch and a second guard switch and the second plurality of transistors comprises a third guard switch and a fourth guard switch, and wherein the first output is coupled to a drain of the first guard switch and a drain of the second guard switch, and the second output is coupled to a drain of the third guard switch and a drain of the fourth guard switch.

15. The level shifting circuit of claim 9 wherein the first voltage comprises 1.7 volts and the second voltage comprises negative 0.4 volts.

16. The level shifting circuit of claim 9 wherein the first plurality of transistors and the second plurality of transistors are configured to prevent overvoltage of the first pair and the second pair, wherein overvoltage comprises a potential difference of greater than 1.5 volts from gate-to-source or drain-to-source across any one of the first pair and the second pair.

* * * * *